(12) United States Patent
Kondo et al.

(10) Patent No.: US 9,413,391 B2
(45) Date of Patent: Aug. 9, 2016

(54) CHIEN SEARCH DEVICE, STORAGE DEVICE, AND CHIEN SEARCH METHOD

(71) Applicant: Kabushiki Kaisha Toshiba, Minato-ku (JP)

(72) Inventors: Yosuke Kondo, Fujisawa (JP); Kenji Yoshida, Kamakura (JP); Hidetoshi Tsuneda, Yamato (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 119 days.

(21) Appl. No.: 14/326,777

(22) Filed: Jul. 9, 2014

(65) Prior Publication Data

US 2015/0303945 A1    Oct. 22, 2015

Related U.S. Application Data

(60) Provisional application No. 61/981,544, filed on Apr. 18, 2014.

(51) Int. Cl.
*H03M 13/00* (2006.01)
*H03M 13/15* (2006.01)

(52) U.S. Cl.
CPC ........ *H03M 13/1545* (2013.01); *H03M 13/157* (2013.01); *H03M 13/158* (2013.01)

(58) Field of Classification Search
None
See application file for complete search history.

(56) References Cited

U.S. PATENT DOCUMENTS

| | | | | |
|---|---|---|---|---|
| 5,414,719 A * | 5/1995 | Iwaki | ...................... | G06F 7/724 708/492 |
| 5,699,368 A * | 12/1997 | Sakai | .................. | H03M 13/151 714/757 |
| 5,983,389 A * | 11/1999 | Shimizu | .............. | H03M 13/151 714/781 |
| 6,550,035 B1 | 4/2003 | Okita | | |
| 6,571,368 B1 * | 5/2003 | Chen | ................. | H03M 13/1515 714/784 |
| 8,418,028 B2 | 4/2013 | Yamaga | | |
| 2004/0010742 A1 * | 1/2004 | Williamson | ........ | H03M 13/159 714/746 |
| 2013/0080863 A1 | 3/2013 | Hida et al. | | |

FOREIGN PATENT DOCUMENTS

| | | |
|---|---|---|
| JP | 2000-124813 | 4/2000 |
| JP | 2001-044853 | 2/2001 |
| JP | 2013-201503 | 10/2013 |

* cited by examiner

*Primary Examiner* — Daniel McMahon
(74) *Attorney, Agent, or Firm* — Oblon, McClellands, Maier & Neustadt, L.L.P.

(57) ABSTRACT

According to one embodiment, a chien search device includes n operation units configured to perform exclusive-OR operations, for each of the coefficients. Further, the chien search device includes first register configured to hold operation results of a highest order operation unit, for each of the coefficients. Furthermore, the chien search device includes exclusive-OR operation unit configured to perform exclusive-OR operations of the results of the first exclusive-OR operations of the highest order operation unit, for each of the coefficients. Moreover, the chien search device includes second register configured to hold operation results of the exclusive-OR operation unit, for each of the coefficients. The respective operation units reduce the number of stages of exclusive-OR operations by using the second register values.

18 Claims, 4 Drawing Sheets

CHIEN SEARCH DEVICE, STORAGE DEVICE, AND CHIEN SEARCH METHOD

CROSS-REFERENCE TO RELATED APPLICATIONS

This application is based upon and claims the benefit of priority from U.S. Provisional Application No. 61/981,544, filed on Apr. 18, 2014; the entire contents of which are incorporated herein by reference.

FIELD

Embodiments described herein relate generally to a chien search device, a storage device, and a chien search method.

BACKGROUND

In a storage device using a semiconductor memory or the like, error correction processing is performed in data decoding processing. There is a chien search as a method of specifying error locations of data in the error correction processing. In the chien search, exclusive-OR operations multiplying α to the power, which multiply coefficients of an error location polynomial (t-order or less) except for a constant term by $\alpha, \alpha^2, \ldots, \alpha^t$, and exclusive-OR operations, which obtain the sum of the respective results of the operations on a Galois field, are performed to specify error locations by searching roots. Since error locations are determined in every cycle in a chien search circuit, all the exclusive-OR operations are performed in one cycle. Meanwhile, it is possible to improve error correction capability by increasing the order of the Galois field or the order of the error location polynomial in the chien search circuit, but the number of stages of the exclusive-OR operations is increased.

DETAILED DESCRIPTION

Exemplary embodiments of a chien search device, a storage device, and a chien search method will be descried in detail below with reference to the accompanying drawings. Meanwhile, the invention is not limited to these embodiments.

First Embodiment

In general, according to this embodiment, a chien search device performs chien searches of n (n is a natural number of 2 or more) bits in parallel on the basis of coefficients of terms of an error location polynomial calculated by an error location polynomial operation. The chien search device includes n operation units configured to perform first exclusive-OR operations on the basis of an operation expression decided according to rule of Galois field, for each coefficient. Further, the chien search device includes a first register configured to hold operation results of the highest order operation unit performing operations multiplying α to the power of the highest order, among the n operation units, for each coefficient. Furthermore, the chien search device includes an exclusive-OR operation unit configured to perform second exclusive-OR operations of the operation results of the highest order operation unit, for each coefficient. Moreover, the chien search device includes a second register configured to hold operation results of the exclusive-OR operation unit, for each coefficient. The respective n operation units input first register values obtained from the first register and second register values obtained from the second register, and use the second register values in operations capable of reducing the number of stages of first exclusive-OR operations by using the second register values.

Figure 1:
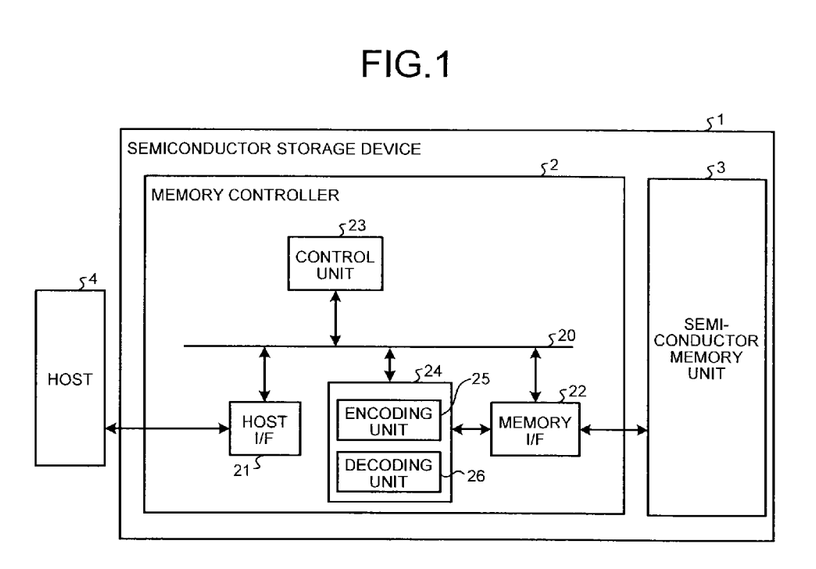
FIG. 1 is a block diagram showing a configuration example of a semiconductor storage device (storage device) according to a first embodiment.

FIG. 1 is a block diagram illustrating an example of the configuration of a semiconductor storage device (storage device) 1 according to a first embodiment. The semiconductor storage device 1 according to this embodiment includes a memory controller (memory control section) 2 and a semiconductor memory unit (memory unit) 3. The semiconductor storage device 1 is connected to a host 4 through a communication interface, and functions as an external storage medium for the host 4. Examples of the host 4 include a personal computer and a central processing unit (CPU) core.

The memory unit 3 is formed of a non-volatile semiconductor memory, such as a NAND flash memory. The memory unit 3 may include a single memory chip or a plurality of memory chips.

The memory controller 2 includes an internal bus 20, a host interface (I/F) 21, a memory I/F (a memory control unit) 22, a control unit 23, and an encoding/decoding processing unit 24. The encoding/decoding processing unit 24 includes an encoding unit 25 and a decoding unit (decoder) 26.

The host I/F 21 outputs instructions, data, and the like, which are received from the host 4, to the internal bus 20. Further, the host I/F 21 sends data that are input through the internal bus 20, response notification that is received from the control unit 23 (a notification or the like indicating the completion of the execution of the instructions), and the like to the host 4. The host I/F 21 is compliant with, for example, a communication interface standard, such as serial advanced technology attachment (SATA), serial attached SCSI (SAS), or peripheral component interconnect (PCI) express.

The control unit 23 is a control unit that generally controls the respective components of the semiconductor storage device 1, and includes a CPU core, a random access memory (RAM), a read only memory (ROM), a direct memory access (DMA) controller, and the like. When the control unit 23 receives instructions from the host 4 through the host I/F 21 and the internal bus 20, the control unit 23 performs control according to the instructions. For example, the control unit 23 instructs the memory I/F 22 to write data in the semiconductor memory unit 3, to read data from the semiconductor memory unit 3, and the like according to the instructions received from the host 4. Further, the control unit 23 instructs the encoding/decoding processing unit 24 to perform error correction encoding processing or decoding processing.

The encoding/decoding processing unit 24 performs the error correction encoding processing of user data received from the host 4, outputs the user data to the memory I/F 22, and performs decoding processing of code data, which are input from the memory I/F 22, on the basis of the instructions of the control unit 23. The memory I/F 22 reads and writes data in the semiconductor memory unit 3 on the basis of the instructions of the control unit 23.

Meanwhile, the configuration of the semiconductor storage device 1 illustrated in FIG. 1 is an example. As long as the semiconductor storage device 1 includes the semiconductor memory unit 3 and a controller for controlling the reading and writing of the semiconductor memory unit 3 and can communicate with the host 4, the semiconductor storage device 1 may have any configuration without being limited to the configuration illustrated in FIG. 1. Further, a storage unit other than the semiconductor memory may be used instead of the semiconductor memory unit 3.

Next, an operation for writing data in the semiconductor memory unit 3 of this embodiment will be described. First, when the writing of user data is instructed from the host 4, the control unit 23 instructs the encoding/decoding processing unit 24 to encode data and instructs the memory I/F 22 to write data in the semiconductor memory unit 3. User data, which are sent from the host 4 and are to be written, are written in a buffer memory (not illustrated) that is provided in the semiconductor storage device 1. The encoding unit 25 of the encoding/decoding processing unit 24 performs error correction encoding of the user data that are input from the buffer memory, and outputs generated redundant data to the memory I/F 22. The memory I/F 22 writes the user data, which are input from the buffer memory, and the redundant data, which are generated by the encoding unit 25, in the semiconductor memory unit 3.

Any code may be used as an error correction code, but, for example, a BCH code, a reed-solomon (RS) code, and the like can be used as the error correction code. The BCH code will be described below by way of example.

Next, an operation for reading data from the semiconductor memory unit 3 of this embodiment will be described. When the reading of data is instructed from the host 4, the control unit 23 instructs the encoding/decoding processing unit 24 to decode data and instructs the memory I/F 22 to read data from the semiconductor memory unit 3. The memory I/F 22 reads user data and corresponding redundant data from the semiconductor memory unit 3 on the basis of instructions from the control unit 23, and outputs the user data and the corresponding redundant data to the encoding/decoding processing unit 24. The decoding unit 26 of the encoding/decoding processing unit 24 performs decoding processing of the user data and the redundant data that have been read. If the decoding unit 26 determines that an error is present in the read user data, the decoding unit 26 performs error correction. The host I/F 21 sends user data, which has been subjected to error correction, to the host 4. When an error is not present in the read user data, the decoding unit 26 sends the read user data to the host 4 as it is.

Figure 2:
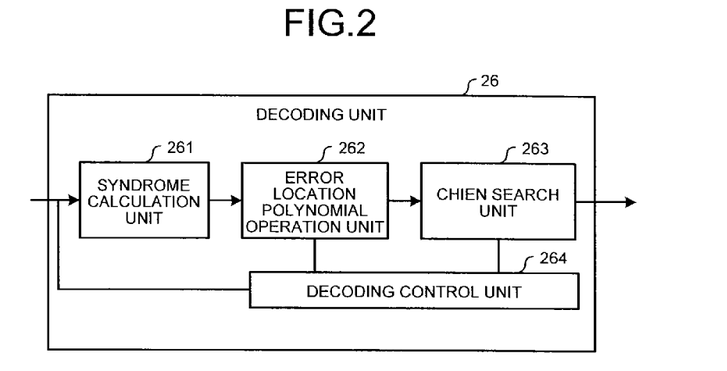
FIG. 2 is a diagram showing a configuration example of a decoding unit of the first embodiment.

The decoding processing of this embodiment will be described below. FIG. 2 is a diagram illustrating an example of the configuration of the decoding unit 26 of the first embodiment. The decoding unit (decoder) 26 includes a syndrome calculation unit 261, an error location polynomial operation unit 262, a chien search unit (error location calculation unit) 263, and a decoding control unit 264.

When the control unit 23 receives a user data reading request from the host 4 through the host I/F 21, the control unit 23 instructs the memory I/F 22 to read user data that are to be read. The memory I/F 22 reads user data, which are to be read, together with corresponding redundant data, and transmits the user data and the corresponding redundant data to the decoding unit 26. When the decoding unit 26 receives the user data, which are to be read, from the memory I/F 22, the decoding unit 26 starts the decoding processing.

When the decoding unit 26 starts the decoding processing, the decoding control unit 264 instructs the syndrome calculation unit 261 to perform syndrome calculation and the syndrome calculation unit 261 performs the syndrome calculation. After that, the decoding control unit 264 instructs the error location polynomial operation unit 262 to perform an error location polynomial operation by using the result of the syndrome calculation, which has been completed, and the error location polynomial operation unit 262 performs the error location polynomial operation.

The error location polynomial operation is processing for calculating coefficients $\sigma_1, \sigma_2, \ldots$ of "$\sigma(x)=1+\sigma_1 x^1+\sigma_2 x^2+\ldots$" from a syndrome value when an error location polynomial is denoted by $\sigma(x)$. Examples of a specific method include a BM method, a Euclidean algorithm, and a Peterson method. The Peterson method is a method of solving simultaneous equations, which are satisfied between the coefficients $\sigma$ and the syndrome, by matrix calculation, and the BM method and the Euclidean algorithm are methods of sequentially calculating simultaneous equations, which are satisfied between the coefficients $\sigma$ and the syndrome, by polynomials. Meanwhile, any method may be used for the calculation of the error location polynomial during the decoding processing.

Next, the decoding control unit 264 instructs the chien search unit 263 to perform chien searches by using the results of the error location polynomial operation. The chien search unit 263 performs the chien searches by using the coefficients $\sigma_1, \sigma_2, \ldots$, specifies an error location, and ends the processing. The chien search is a method of searching an error locator, which is a value satisfying "$\sigma(x)=0$", by sequentially substituting values into the error location polynomial $\sigma(x)$. When "$\sigma(x)=0$" is satisfied by a chien search, the decoding control unit 264 determines that an error is present in a corresponding bit and performs error correction by inverting the bit.

Figure 3:
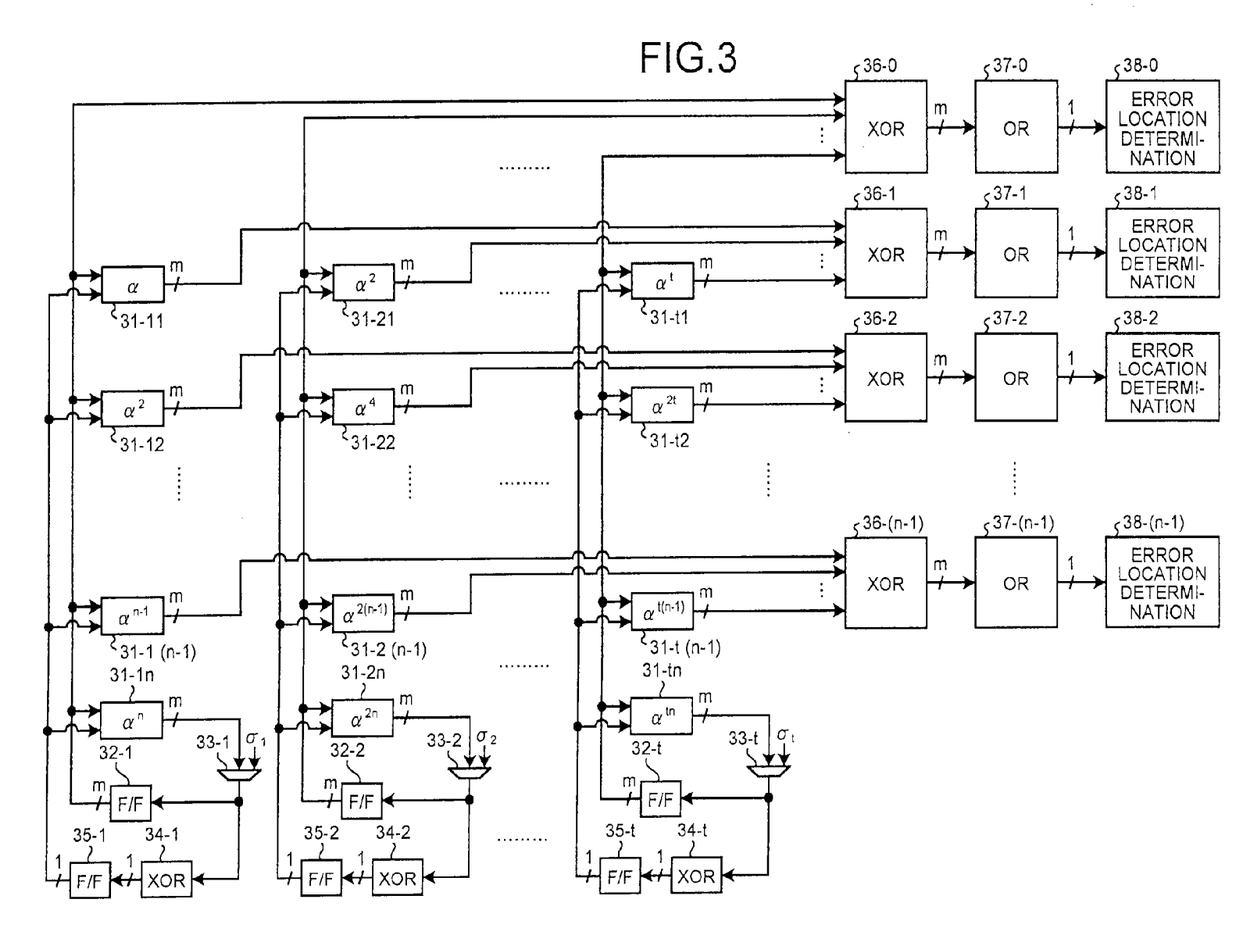
FIG. 3 is a diagram showing a configuration example of a chien search unit (chien search device) of the first embodiment.

Next, the chien search unit 263 of this embodiment will be described. FIG. 3 is a diagram illustrating an example of the configuration of the chien search unit 263 (chien search device) of the first embodiment. Here, the error location polynomial is a t-th order polynomial $\sigma(x)=1+\sigma_1 x^1+\sigma_2 x^2 \ldots \sigma_t x^t$. Further, since the chien search unit 263 parallelizes chien search circuits, the chien search unit 263 can simultaneously perform error location determination in a plurality of bits, for example, by eight bits or sixteen bits in accordance with data buses. A case in which the chien search unit 263 performs error location determination by n (n is a natural number of 2 or more) bits will be described here by way of example.

The chien search unit 263 includes t×n operation units 31-11, 31-12, ..., 31-*tn*, t registers (first registers) 32-1, 32-2, ..., 32-*t*, t selector units 33-1, 33-2, ..., 33-*t*, t exclusive-OR operation (XOR) units 34-1, 34-2, ..., 34-*t*, t registers (second registers) 35-1, 35-2, ..., 35-*t*, n exclusive-OR operation (XOR) units 36-0, 36-1, ..., 36-($n-1$), n OR operation (OR) units 37-0, 37-1, ..., 37-($n-1$), and n error location determination units 38-0, 38-1, ..., 38-($n-1$). The processing of exclusive-OR operations of the XOR units 36-0 to 36-($n-1$), OR operations of the OR units 37-0 to 37-($n-1$), and the error location determination of the error location determination units 38-0 to 38-($n-1$), after the respective operation units 31-11 to 31-*tn* perform exclusive-OR operations by using first and second register values, as one cycle is repeatedly performed predetermined times. As a result, a chien search operation is performed.

The operation units 31-11 to 31-*tn* perform exclusive-OR operations (first exclusive-OR operations), which correspond to operations multiplying α to the power of corresponding chien searches, by using register values (first register values) that are input from the corresponding registers 32-1 to 32-*t* and register values (second register values) that are input from the corresponding registers 35-1 to 35-*t*. The corresponding registers of the chien search unit 263 illustrated in FIG. 3 correspond to the registers 32-*t* and 35-*t* of which "t" is attached to the ends of reference numerals in the case of, for example, the operation unit 31-*tn*. Each of the operation units 31-11 to 31-*tn* performs an exclusive-OR operation corresponding to an operation multiplying α to the power of a value, which is obtained by the multiplication of numerals attached to the end of the reference numeral, as an operation multiplying α to the power. For example, the operation unit 31-11 performs an exclusive-OR operation corresponding to an operation of "$α^1$" to the power of "1×1", and the operation unit 31-*tn* performs an exclusive-OR operation corresponding to an operation of "$α^{m}$" to the power of "t×n".

The selector units 33-1 to 33-*t* output the coefficients $σ_1$, $σ_2$, ... $σ_t$ of the error location polynomial σ(x) except for a constant term at the first time of the operations of the registers 32-1 to 32-*t* and the XOR units 34-1 to 34-*t*, respectively. In the other cases (in the subsequent operations), the selector units 33-1 to 33-*t* output operation results from the operation units (the highest order operation units) 31-1*n*, 31-2*n*, ..., 31-*tn*, which perform exclusive-OR operations corresponding to the operations multiplying α to the power of the highest order, among the n operation units 31-11 to 31-*tn* corresponding to the respective coefficients.

The registers (flip flops) 32-1 to 32-*t* input data from the selector units 33-1 to 33-*t*, respectively, and are initialized with the coefficients $σ_1$, $σ_2$, ... $σ_t$ of the error location polynomial σ(x) except for the constant term. Further, the registers 32-1 to 32-*t* hold the operation results that are obtained from the operation units (the highest order operation units) 31-1*n*, 31-2*n*, ..., 31-*tn*. The registers 32-1 to 32-*t* output register values (the first register values), which are held, to the respective operation units that correspond to the respective coefficients of the error location polynomial σ(x).

The XOR units 34-1 to 34-*t* perform exclusive-OR operations (second exclusive-OR operations) of data, which are input from the selector units 33-1 to 33-*t*, respectively, as previous operations of the chien searches. Here, the XOR units 34-1 to 34-*t* perform exclusive-OR operations of all m bits of the input data.

The registers (flip flops) 35-1 to 35-*t* hold the operation results of the exclusive-OR operations of the XOR units 34-1 to 34-*t*, respectively. The registers 35-1 to 35-*t* output register values (the second register values), which are held, to the respective operation units that correspond to the respective coefficients of the error location polynomial σ(x).

The XOR unit 36-0 inputs register values obtained from the registers 32-1 to 32-*t*, performs an exclusive-OR operation, and outputs operation results of m bits.

The XOR units 36-1 to 36-(*n*−1) further perform exclusive-OR operations of the operation results of the operation units 31-11, ..., 31-1(*n*−1), ..., 31-*t*1, ..., 31-*t*(n−1) corresponding to the respective data buses, and output operation results of m bits.

The OR units 37-0 to 37-(*n*−1) perform OR operations of the operation results of m bits of the XOR units 36-0 to 36-(*n*−1), respectively, and output operation results of "0" or "1".

The error location determination units 38-0 to 38-(*n*−1) determine error locations from the operation results of the OR units 37-0 to 37-(*n*−1), respectively. If the operation results are "0", the error location determination units 38-0 to 38-(*n*−1) determine that the positions of code words corresponding to the number of times of the processing from the respective operation units 31-11 to 31-*tn* to the error location determination are erroneous at that time.

First, the procedure of a basic chien search operation will be described. The procedure of an operation, which does not use the XOR units 34-1 to 34-*t* and the registers 35-1 to 35-*t*, will be described here. In the chien search unit 263, the t registers 32-1 to 32-*t* are initialized with the coefficients $σ_1$, $σ_2$, ... $σ_t$ of σ(x) except for the constant term. The registers 32-1 to 32-*t* hold the coefficients $σ_1$, σ2, ... $σ_t$ and output the coefficients to the operation units 31-11, 31-12, ..., 31-*tn* as register values, respectively. The respective operation units 31-11, 31-12, ..., 31-*tn* perform exclusive-OR operations corresponding to the operations multiplying α to the power in the chien searches.

The error location determination units 38-0 to 38-(*n*−1) determine whether or not "σ(α)=0" is satisfied by the results of the operations of the XOR units 36-0 to 36-(*n*−1) and the OR units 37-0 to 37-(*n*−1). If "σ(α)=0" is satisfied, the error location determination units 38-0 to 38-(*n*−1) determine that the positions of code words corresponding to the number of times of the processing from the respective operation units 31-11 to 31-*tn* to the error location determination are erroneous at that time. Since the chien search unit 263 includes the n error location determination units and parallelizes the chien search circuits as described above, the chien search unit 263 can perform error location determination by n bits.

Figure 4:
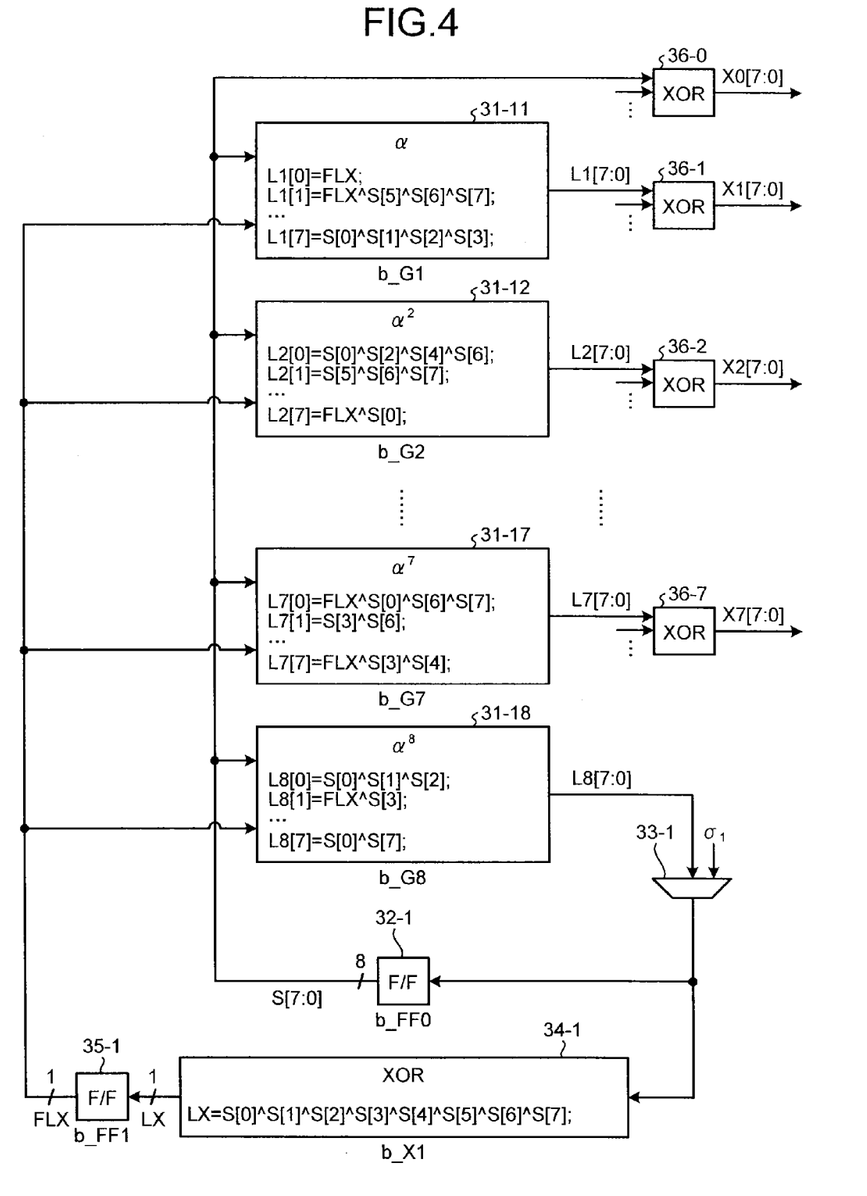
FIG. 4 is a diagram showing operation contents of a portion of the chien search unit corresponding to a coefficient $\sigma_1$ of an error location polynomial σ(x)

FIG. 4 is a diagram illustrating operation contents of a portion of the chien search unit 263, which is illustrated in FIG. 3, corresponding to the coefficient $σ_1$ of the error location polynomial σ(x). Specifically, FIG. 4 illustrates Galois field GF($2^8$), that is, an example of an operation path up to the error location determination when "m=8" is satisfied in FIG. 3. The operation units 31-11, 31-12, ..., 31-*tn* can obtain the results of operations multiplying α to the power by the exclusive-OR operation of input bits that are selected by a primitive polynomial of a Galois field.

The chien search unit 263 having the circuit structure, which are parallelized into n circuits, needs to perform t exclusive-OR operations multiplying α to the power and exclusive-OR operations for taking the sum of the results of these operations, in order to determine the respective error locations. Accordingly, it is necessary to complete all these exclusive-OR operations in one cycle in order to determine error locations in one cycle.

In the operation processing that does not use the XOR unit 34-1 and the register 35-1, the length of the operation path up to the error location determination is determined according to the number of stages of the exclusive-OR operations when α to the power is obtained. In this case, when many exclusive-OR operations are performed for S[7:0] of eight bits that are input to an operation multiplying α to the power, the operation path is lengthened. For example, in FIG. 4, an operation path passing through L1[0] becomes the longest path when the exclusive-OR operations of all the input bits S[7:0] are performed to obtain L1[0] of L1[7:0].

The chien search unit 263 needs to perform all the exclusive-OR operations in one cycle to determine error locations in every cycle. Further, it becomes difficult for the exclusive-OR operations to be performed in one cycle in the chien search unit 263 as the operating frequency of a circuit becomes high. When the operating frequency becomes high, logic synthesis is optimized by using logic cells having high drive capability at the time of logic synthesis so that all the exclusive-OR operations are performed in one cycle. Accordingly, a circuit scale tends to increase. The logic cell is the smallest circuit that fulfills a logical operation function of the register, the XOR unit or the like.

In this embodiment, the results of the exclusive-OR operations of all eight bits, which are operated by the XOR unit 34-1, are input to the respective operation units 31-11 to 31-18 through the register 35-1 in order to shorten the operation path.

The XOR unit 34-1 performs the exclusive-OR operations of all the eight bits with respect to L8[7:0] that returns to the register 32-1. The register 35-1 holds the result of the operation of the XOR unit 34-1.

In the operation units 31-11 to 31-18, in the operations multiplying α to the power, operation portions, which are obtained by the exclusive-OR operation of five or more bits more than a half of the input bits S[7:0], are performed by the exclusive-OR operations of the input bits, which are not subjected to the exclusive-OR operation, and output FLX from the register 35-1 that performs the exclusive-OR operations of all the L8[7:0] and holds all the L8[7:0].

Accordingly, in the operation units 31-11 to 31-18, it is possible to convert the exclusive-OR operations of five bits or more into the exclusive-OR operations of four bits or less and to shorten the operation path by reducing the number of operation stages of the exclusive-OR operations. A fact that this structure is logically equivalent will be described below.

In FIG. 4, an operation (exclusive-OR operation) multiplying α to the power, which is performed by the operation unit 31-11, is expressed as follows without using "FLX=S[0]^S[1]^S[2]^S[3]^S[4]^S[5]^S[6]^S[7]".

L1[0]=S[0]^S[1]^S[2]^S[3]^S[4]^S[5]^S[6]^S[7]L1[1]=S[0]^S[1]^S[2]^S[3]^S[4]

Here, since L1[0] is the same as the FLX when the FLX is used, "L1[0]=FLX" is satisfied. Likewise, when the FLX is used, L1[1] can be converted as follows.

L1[1]=FLX^S[5]^S[6]^S[7]

$$L1[1] = S[0]^\wedge S[1]^\wedge S[2]^\wedge S[3]^\wedge S[4]^\wedge S[5]^\wedge S[6]^\wedge S[7]^\wedge S[5]^\wedge S[6]^\wedge S[7] =$$

$$S[0]^\wedge S[1]^\wedge S[2]^\wedge S[3]^\wedge S[4]$$

In FIG. 4, the number of stages of the exclusive-OR operations of the other operation units 31-12 to 31-18 can also be reduced in the same way by using the FLX.

That is, when the exclusive-OR operation of the same bit is performed two times in this embodiment, the results of the operation become 0. Accordingly, the characteristics of the exclusive-OR operation in which bits not subjected to the exclusive-OR operation are equivalent are used. Accordingly, each of the operation units 31-11 to 31-18 suppresses the operations of five or more bits to operations of four or less bits by using the input of three or less bits that are not operated and one bit that has been previously operated. In the XOR unit 34-1, the exclusive-OR operations of eight bits are performed as previous operations. However, since the results of the operations are used in the next cycle, the number of stages of the operations for determining error locations is not affected. Since an operation expression decided according to rule of Galois field to be used is already known in each of the operation units 31-11 to 31-18, an operation expression in which the number of stages of an exclusive-OR operation has been reduced can be previously set according to the contents of the operation that is performed by the XOR unit 34-1.

Specifically, the operation of the portion corresponding to the coefficient σ₁ of the error location polynomial σ(x) has been described in FIG. 4. However, even in the cases of the operations of the portions corresponding to the other coefficients illustrated in FIG. 3, the number of stages of the exclusive-OR operations can be reduced by the same operation as described above.

As described above, the structure, which shortens the path of the exclusive-OR operation by the previous operation, is added to the structure, which can perform the basic chien search operation, in the chien search unit 263 of this embodiment. The structure, which shortens the path of the exclusive-OR operation, is the t XOR units 34-1 to 34-*t*, which perform exclusive-OR operations in response to all signals of m bits returning to the registers 32-1 to 32-*t*, and the t registers 35-1 to 35-*t* that hold the results of the operations of the XOR units 34-1 to 34-*t*, respectively.

Since the structure (circuit) that shortens the path of the exclusive-OR operation is added, it is considered that a circuit scale increases in the configuration of the chien search unit 263 illustrated in FIG. 3. However, when the order of the Galois field or the order t of the error location polynomial is increased and the operating frequency of the circuit is high, a circuit scale does not increase. Conversely, an effect of reducing the entire circuit scale is also obtained in the chien search unit 263. The reason for that will be described below.

Generally, when the order of the Galois field or the order t of the error location polynomial is increased in the chien search circuit, the number of stages of the exclusive-OR operations performed in one cycle is increased. Further, when the operating frequency of the circuit becomes high, the time required for performing all the exclusive-OR operations is shortened. As a result, there is a possibility that processing may not be completed in one cycle and timing violations may occur. The shortening of the operating time of the exclusive-OR operation by using logic cells having high drive capability at the time of logic synthesis is effective to eliminate timing violations. However, the gate scale of a logic cell having high drive capability is larger than that of a logic cell having low drive capability. Accordingly, the circuit scale of the entire chien search circuit is increased with the increase of the number of used logic cells having high drive capability.

However, since the path of the exclusive-OR operation is shortened in the chien search unit 263 of this embodiment, the number of stages of the exclusive-OR operations performed in one cycle is reduced. Accordingly, there is time to spare, so that many logic cells having high drive capability do not need to be used. Therefore, when the increase of a circuit scale, which is caused by the use of logic cells having high drive capability, is equal to or larger than the increase of a circuit scale that is caused by the addition of the exclusive-OR operations and the registers, an effect capable of reducing the entire circuit scale is obtained in the chien search unit 263 described in this embodiment. Further, the chien search unit 263 is a structure that is effective to eliminate timing violations even when a circuit scale is increased.

The chien search unit 263 of this embodiment can make the operating frequency of the circuit higher than the related art. Furthermore, the chien search unit 263 can reduce consumption current when logic cells having low drive capability can be used. Generally, since a logic cell having low drive capability is smaller than a logic cell itself having high drive capability, a circuit scale can be reduced in the chien search unit 263.

Figure 5:
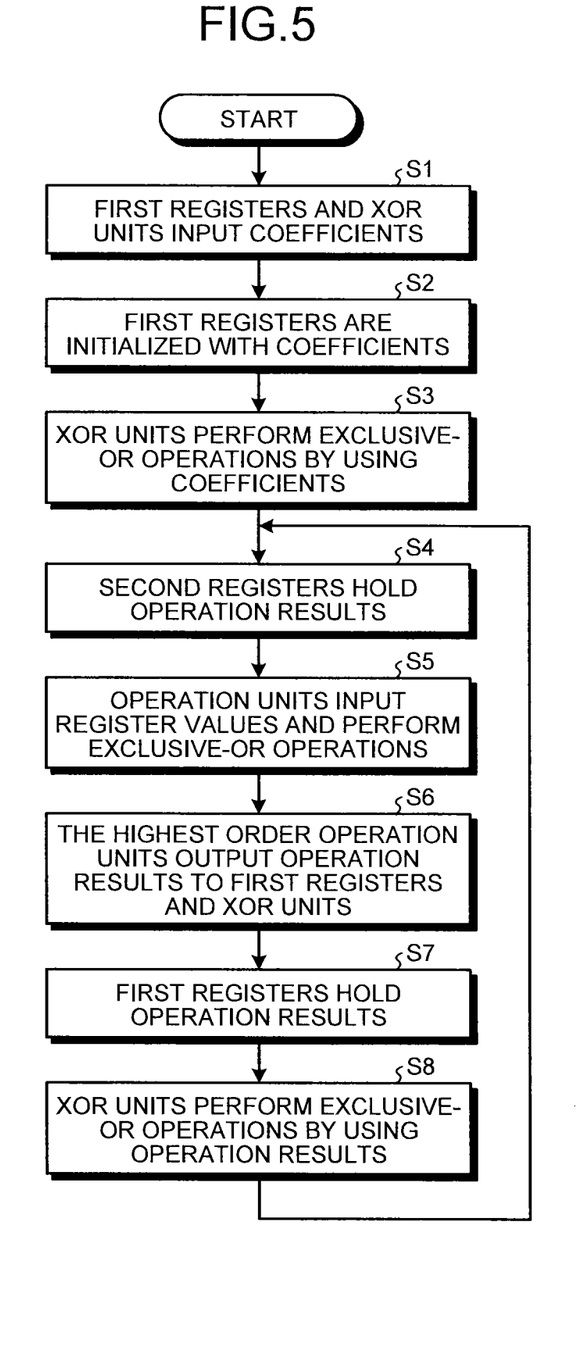
FIG. 5 is a flowchart showing a chien search method according to the first embodiment.

FIG. 5 is a flowchart illustrating a chien search method according to the first embodiment. First, in the chien search unit 263, the registers (first registers) 32-1 to 32-*t* and the XOR units 34-1 to 34-t input the respective corresponding coefficients of the error location polynomial σ(x) at the first time of a chien search operation (Step S1). The registers (first registers) 32-1 to 32-t are initialized with the input coefficients (Step S2). The XOR units 34-1 to 34-t perform exclusive-OR operations with the input coefficients (Step S3).

The registers (second registers) 35-1 to 35-t hold the operation results of the exclusive-OR operations that are performed by the XOR units 34-1 to 34-t, respectively (Step S4). The operation units 31-11 to 31-tn input register values from the corresponding registers (first registers) 32-1 to 32-t and the corresponding registers (second registers) 35-1 to 35-t, and perform exclusive-OR operations (Step S5). The operation units 31-1n to 31-tn, which are the highest order operation units, output the operation results to the registers (first registers) 32-1 to 32-t and the XOR units 34-1 to 34-t through the selector units 33-1 to 33-t (Step S6). The registers (first registers) 32-1 to 32-t hold the input operation results (Step S7). The XOR units 34-1 to 34-t perform exclusive-OR operations with the input operation results (Step S8). After that, the processing returns to Step S4 and the same operation is repeatedly performed predetermined times in the chien search unit 263.

According to the first embodiment, in a parallelized chien search circuit that requires fast processing with high operating frequency, the chien search unit 263 performs the previous operations of the exclusive-OR operations of all the input bits that are used in the operation multiplying α to the power, holds the operation results of the exclusive-OR operations, and performs exclusive-OR operations corresponding to operations multiplying α to the power in the chien searches by using the held operation results of the exclusive-OR operations. As a result, it is possible to obtain an effect capable of shortening the operation path in the chien search circuit by the logic synthesis of circuits to which this embodiment is applied, and an effect capable of reducing the number of stages of the exclusive-OR operations, which are performed in one cycle, of operation portions of the Galois field, which easily causes timing violations, without the reduction of the processing speed. Further, since the number of stages of the exclusive-OR operations is reduced, it is possible to use logic cells having drive capability lower than the related art. Furthermore, even when logic cells having low drive capability are used, it is possible to suppress the occurrence of timing violations. Moreover, it is possible to obtain an effect of further reducing a circuit scale than the increase of the number of circuits that are added for the previous operations.

Second Embodiment

In the first embodiment, the XOR units 34-1 to 34-t have performed the exclusive-OR operations of all the input bits as the previous operations of the exclusive-OR operations. However, a method of reducing the number of stages of the exclusive-OR operations is not limited thereto.

As the previous operations of the exclusive-OR operations, the XOR units 34-1 to 34-t may select the combination of input bits, which can shorten the path having a large number of stages of operations in the operation multiplying α to the power of each of the operation units 31-11, 31-12, ..., 31-tn, and may perform the exclusive-OR operations of the selected input bits. For example, when the XOR unit 34-1 performs the operation of S[1]^S[2]^S[3]^S[4] as the previous operation of the exclusive-OR operation in FIG. 4, it is possible to shorten the operation paths of L1[0] and L1[1] of the operation unit 31-11, the operation path of L2[7] of the operation unit 31-12, and the operation path of L7[0] of the operation unit 31-17.

According to the second embodiment, the XOR units 34-1 to 34-t have selected the combination of the input bits and have performed the previous operations of the exclusive-OR operations of some input bits. As a result, it is possible to obtain an effect capable of reducing the number of operations as compared to a case in which the exclusive-OR operations of all the input bits are performed as previous operations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A chien search device configured to perform chien searches of n (n is a natural number of 2 or more) bits in parallel on a basis of coefficients of terms of an error location polynomial calculated by an error location polynomial operation, the chien search device comprising:
   for each of the coefficients,
   n operation units configured to perform first exclusive-OR operations on a basis of a primitive polynomial of a Galois field;
   a first register configured to hold results obtained by a highest order operation unit, the highest order operation unit being among the n operation units, the highest order operation unit being configured to perform the first exclusive-OR operations, the first exclusive-OR operations corresponding to operations multiplying α to a power of highest order;
   an exclusive-OR operation unit configured to perform second exclusive-OR operations of the results of the first exclusive-OR operations, the results of the first exclusive-OR operations being obtained by the highest order operation unit; and
   a second register configured to hold results obtained by the exclusive-OR operation unit,
   wherein each of the n operation units inputs first register values obtained from the first register and second register values obtained from the second register, and reduces a number of stages of the first exclusive-OR operations by using the second register values.

2. The chien search device according to claim 1, wherein the first register is initialized with corresponding coefficients at a first time of operations, and holds, in subsequent operations, the results of the first exclusive-OR operations obtained by the highest order operation unit, and
   the exclusive-OR operation unit performs the second exclusive-OR operations for the corresponding coefficients at the first time of the operations, and performs, in the subsequent operations, the second exclusive-OR operations of the results of the first exclusive-OR operations obtained by the highest order operation unit.

3. The chien search device according to claim 1, wherein the exclusive-OR operation unit performs the second exclusive-OR operations by using all the results of the first exclusive-OR operations obtained by the highest order operation unit.

4. The chien search device according to claim 2, wherein the exclusive-OR operation unit performs the second exclusive-OR operations by using the corresponding coefficients or all the results of the first exclusive-OR operations obtained by the highest order operation unit.

5. The chien search device according to claim 1, wherein the exclusive-OR operation unit performs the second exclusive-OR operations by using a part of the results of the first exclusive-OR operations obtained by the highest order operation unit.

6. The chien search device according to claim 2, wherein the exclusive-OR operation unit performs the second exclusive-OR operations by using the corresponding coefficients or a part of the results the first exclusive-OR operations obtained by the highest order operation unit.

7. A storage device comprising:
a memory unit configured to store code words generated by performing error correction encoding processing;
an error location polynomial operation unit configured to perform an error location polynomial operation on a basis of a syndrome calculated on a basis of code words read from the memory unit;
a chien search unit configured to perform chien searches on a basis of coefficients of terms of an error location polynomial calculated by the error location polynomial operation; and
a decoding control unit configured to perform error correction on a basis of results of the chien searches,
wherein, when the chien searches of n (n is a natural number of 2 or more) bits are performed in parallel, the chien search unit includes
for each of the coefficients,
n operation units configured to perform first exclusive-OR operations on a basis of a primitive polynomial of a Galois field,
a first register configured to hold results obtained by a highest order operation unit, the highest order operation unit being among the n operation units, the highest order operation unit being configured to perform the first exclusive-OR operations, the first exclusive-OR operations corresponding to operations multiplying $\alpha$ to a power of highest order;
an exclusive-OR operation unit configured to perform second exclusive-OR operations of the results of the first exclusive-OR operations, the results of the first exclusive-OR operations being obtained by the highest order operation unit; and
a second register configured to hold results obtained by the exclusive-OR operation unit,
wherein each of the n operation units inputs first register values obtained from the first register and second register values obtained from the second register, and reduces a number of stages of the first exclusive-OR operations by using the second register values.

8. The storage device according to claim 7, wherein the first register is initialized with corresponding coefficients at a first time of operations, and holds, in subsequent operations, the results of the first exclusive-OR operations obtained by the highest order operation unit, and
the exclusive-OR operation unit performs the second exclusive-OR operations for the corresponding coefficients at the first time of the operations, and performs, in the subsequent operations, the second exclusive-OR operations of the results of the first exclusive-OR operations obtained by the highest order operation unit.

9. The storage device according to claim 7, wherein the exclusive-OR operation unit performs the second exclusive-OR operations by using all the results of the first exclusive-OR operations obtained by the highest order operation unit.

10. The storage device according to claim 8, wherein the exclusive-OR operation unit performs the second exclusive-OR operations by using the corresponding coefficients or all the results the first exclusive-OR operations obtained by the highest order operation unit.

11. The storage device according to claim 7, wherein the exclusive-OR operation unit performs the second exclusive-OR operations by using a part of the results the first exclusive-OR operations obtained by the highest order operation unit.

12. The storage device according to claim 8, wherein the exclusive-OR operation unit performs the second exclusive-OR operations by using the corresponding coefficients or a part of the results the first exclusive-OR operations obtained by the highest order operation unit.

13. A chien search method of a chien search device configured to perform chien searches of n (n is a natural number of 2 or more) bits in parallel on a basis of coefficients of terms of an error location polynomial calculated by an error location polynomial operation, the chien search method comprising:
for each of the coefficients,
performing first exclusive-OR operations on a basis of a primitive polynomial of a Galois field;
holding results of the first exclusive-OR operations as first register values, the first exclusive-OR operations corresponding to operations multiplying $\alpha$ to a power of highest order;
performing second exclusive-OR operations of the results of the first exclusive-OR operations of multiplying $\alpha$ to the power of the highest order;
holding results of the second exclusive-OR operations as second register values; and
inputting the first register values and the second register values, and reducing a number of stages of the first exclusive-OR operations by using the second register values.

14. The chien search method according to claim 13, further comprising:
performing initialization with corresponding coefficients at a first time of operations, and holding, in subsequent operations, the results of the first exclusive-OR operations of multiplying $\alpha$ to the power of the highest order as the first register values; and
performing, as the second exclusive-OR operations, exclusive-OR operations for the corresponding coefficients at the first time of the operations, and performing, as the second exclusive-OR operations, exclusive-OR operations of the results of the first exclusive-OR operations of multiplying $\alpha$ to the power of the highest order in the subsequent operations.

15. The chien search method according to claim 13, wherein exclusive-OR operations are performed as the second exclusive-OR operations by using all the results of the first exclusive-OR operations of multiplying $\alpha$ to the power of the highest order.

16. The chien search method according to claim 14, wherein the exclusive-OR operations are performed as the second exclusive-OR operations by using the corresponding coefficients or all the results of the first exclusive-OR operations of multiplying $\alpha$ to the power of the highest order.

17. The chien search method according to claim 13, wherein exclusive-OR operations are performed as the second exclusive-OR operations by using a part of the results of the first exclusive-OR operations of multiplying $\alpha$ to the power of the highest order.

18. The chien search method according to claim 14, wherein the exclusive-OR operations are performed as the second exclusive-OR operations by using the corresponding coefficients or a part of the results of the first exclusive-OR operations of multiplying $\alpha$ to the power of the highest order.

\* \* \* \* \*